United States Patent
Jang

(10) Patent No.: US 12,309,925 B2
(45) Date of Patent: May 20, 2025

(54) DISPLAY PANEL AND DISPLAY DEVICE INCLUDING THE SAME

(71) Applicant: Samsung Display Co., Ltd., Yongin-Si (KR)

(72) Inventor: Joo-Nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/595,067

(22) Filed: Mar. 4, 2024

(65) Prior Publication Data

US 2024/0206065 A1    Jun. 20, 2024

Related U.S. Application Data

(62) Division of application No. 17/488,894, filed on Sep. 29, 2021, now Pat. No. 11,956,899.

(30) Foreign Application Priority Data

Jan. 13, 2021 (KR) .......................... 10-2021-0004730

(51) Int. Cl.
*H05K 1/11* (2006.01)
*H05K 1/02* (2006.01)
*H05K 1/03* (2006.01)

(52) U.S. Cl.
CPC ............ *H05K 1/117* (2013.01); *H05K 1/028* (2013.01); *H05K 1/0346* (2013.01); *H05K 1/0393* (2013.01); *H05K 2201/0154* (2013.01); *H05K 2201/06* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 2001/0046021 A1 | 11/2001 | Kozuka et al. | |
| 2005/0211464 A1* | 9/2005 | Byun | H01L 24/83 156/306.6 |
| 2019/0237424 A1* | 8/2019 | Tanaka | H01L 24/81 |

FOREIGN PATENT DOCUMENTS

| | | | |
|---|---|---|---|
| JP | 2000311640 A | * | 11/2000 |
| KR | 10-0549796 B1 | | 2/2006 |

OTHER PUBLICATIONS

JP 2000/311640 A Translation (Year: 2024).*
JP 2000-311640 A Translation (Year:2023).

* cited by examiner

Primary Examiner — Hoa C Nguyen
Assistant Examiner — John B Freal
(74) Attorney, Agent, or Firm — Innovation Counsel LLP

(57) ABSTRACT

A display panel includes a substrate including a display area and a pad area, a plurality of pad electrodes disposed on the pad area, and an insulating layer disposed between adjacent ones of the plurality of pad electrodes and including a heat absorbing particle. A laser is irradiated to heat the insulating layer, and the heat absorbing particle in the insulating layer absorbs the heat and cures an anisotropic conductive film by heat transfer to electrically connect the plurality of pad electrodes to a plurality of bump electrodes.

13 Claims, 7 Drawing Sheets

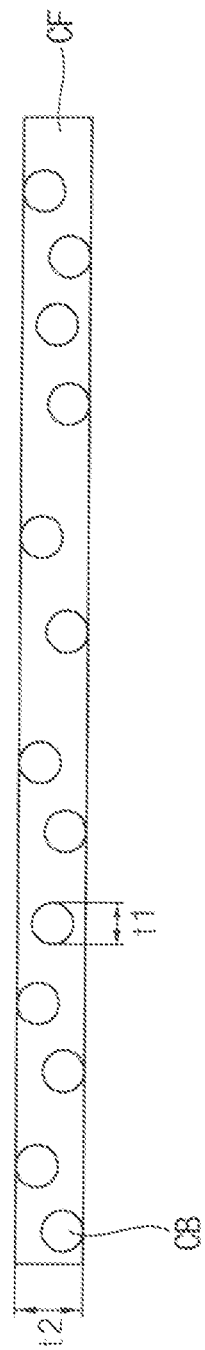

DISPLAY PANEL AND DISPLAY DEVICE INCLUDING THE SAME

CROSS-REFERENCE TO RELATED APPLICATION(S)

This application is a divisional application of U.S. patent application Ser. No. 17/488,894, filed on Sep. 29, 2021, now U.S. Pat. No. 11,956,899, which claims priority to and the benefit of Korean Patent Application No. 10-2021-0004730, filed on Jan. 13, 2021, and the benefits accruing therefrom under 35 U.S.C. § 119, the disclosures of which are hereby incorporated by reference in their entireties.

BACKGROUND

1. Field

The present disclosure relates generally to a display panel and a display device including the same. More specifically, the present disclosure relates to a display panel with improved bonding and a display device including the same.

2. Discussion of the Background

Display devices are often used in computer monitors, televisions (TVs), and mobile phones. Examples of the display device include a plasma display device, an organic light emitting display device, a liquid crystal display device, and a quantum dot display device.

A display panel included in a display device may receive a scan signal, a data signal, or the like from an external device to display an image. The display panel and the external device may be connected through a flexible film. As a size and a resolution of the display device increase, the number of signals input to the display panel may correspondingly increase. Accordingly, the display panel may include a relatively large number of pad electrodes to receive signals from the external device. Bump electrodes of the flexible film may be connected to the pad electrodes of the display device. However, as a relatively large number of pad electrodes are disposed in a limited space of the display panel, a spacing between the pad electrodes may be reduced. Accordingly, a short circuit may occur in a process of bonding the bump electrodes of the flexible film and the pad electrodes of the display panel.

The above information disclosed in this Background section is only for understanding of the background of the present disclosure, and, therefore, it may contain information that may not constitute a prior art.

SUMMARY

Some embodiments of the present disclosure provide a display panel with improved bonding.

Some embodiments of the present disclosure provide a display device including the display panel.

According to an embodiment, a display panel may include a substrate including a display area and a pad area, a plurality of pad electrodes disposed on the pad area, and an insulating layer disposed between adjacent ones of the plurality of pad electrodes and including a heat absorbing particle.

According to an embodiment, the heat absorbing particle may absorb light in an infrared light range.

According to an embodiment, the heat absorbing particle may be a metal particle or a metal oxide particle.

According to an embodiment, the heat absorbing particle may include at least one selected from a group consisting of tungsten oxide, vanadium oxide, iron oxide, carbon nanotube, tellurium oxide, zinc oxide, barium oxide, niobium oxide, aluminum oxide, manganese oxide, aluminum, and iron.

According to an embodiment, the insulating layer may cover a side surface of the plurality of pad electrodes.

According to an embodiment, the plurality of pad electrodes may include at least one selected from a group consisting of indium-tin-oxide, indium-zinc-oxide, and indium-zinc-tin-oxide.

According to an embodiment, a pitch of the plurality of pad electrodes may be about 26 μm or less.

According to an embodiment, a display device may include a substrate including a display area and a pad area, a plurality of pad electrodes disposed on the pad area, a plurality of bump electrodes electrically connected to corresponding ones of the plurality of pad electrodes, and an anisotropic conductive film including a conductive layer and a heat absorbing layer. The anisotropic conductive film may be disposed between the plurality of pad electrodes and the plurality of bump electrodes to electrically connect the plurality of pad electrodes and the plurality of bump electrodes. The conductive layer may be disposed between the pad electrodes and the bump electrodes and may include a conductive ball. The heat absorbing layer may be disposed between adjacent ones of the plurality of bump electrodes and may include a first heat absorbing particle.

According to an embodiment, the first heat absorbing particle may absorb light in an infrared light range.

According to an embodiment, the first heat absorbing particle may be a metal particle or a metal oxide particle.

According to an embodiment, the first heat absorbing particle may include at least one selected from a group consisting of tungsten oxide, vanadium oxide, iron oxide, carbon nanotube, tellurium oxide, zinc oxide, barium oxide, niobium oxide, aluminum oxide, manganese oxide, aluminum, and iron.

According to an embodiment, the display device may further include a flexible film including the plurality of bump electrodes and a base film on which the plurality of bump electrodes is disposed. The base film may include polyimide.

According to an embodiment, a thickness of the conductive layer may be less than about twice a diameter of the conductive ball.

According to an embodiment, a thickness of the conductive layer may be about 3.2 μm to about 6.4 μm.

According to an embodiment, the conductive layer may further include a second heat absorbing particle.

According to an embodiment, the second heat absorbing particle may include at least one selected from a group consisting of tungsten oxide, vanadium oxide, iron oxide, carbon nanotube, tellurium oxide, zinc oxide, barium oxide, niobium oxide, aluminum oxide, manganese oxide, aluminum, and iron.

According to an embodiment, the plurality of bump electrodes may include at least one selected from a group consisting of copper and gold.

According to an embodiment, the display device may further include an insulating layer disposed between adjacent ones of the plurality of pad electrodes.

According to an embodiment, the insulating layer may include a third heat absorbing particle.

According to an embodiment, the third heat absorbing particle may include at least one selected from a group consisting of tungsten oxide, vanadium oxide, iron oxide, carbon nanotube, tellurium oxide, zinc oxide, barium oxide, niobium oxide, aluminum oxide, manganese oxide, aluminum, and iron.

The heat absorbing particle included in at least one of the insulating layer, the conductive layer, and the heat absorbing layer may reduce heat transferred to the flexible film. Accordingly, the amount of stretching of the flexible film due to the transferred heat may be reduced. In other words, the display device may provide an alignment accuracy adequate for ultra-fine pitch bonding in which the pitch of the plurality of pad electrodes is reduced.

In addition, the thickness of the conductive layer may be less than twice the diameter of the conductive ball. Accordingly, the conductive ball flow generated during bonding may be reduced, thereby preventing a short circuit of the display device.

It is to be understood that both the foregoing general description and the following detailed description are examples that are intended to provide further explanation of the present disclosure.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the inventive concepts.

FIG. 7 is a cross-sectional view of a conductive layer according to an embodiment.

DETAILED DESCRIPTION

Illustrative, non-limiting embodiments of the present disclosure will be more clearly understood from the following detailed description in conjunction with the accompanying drawings.

Figure 1:
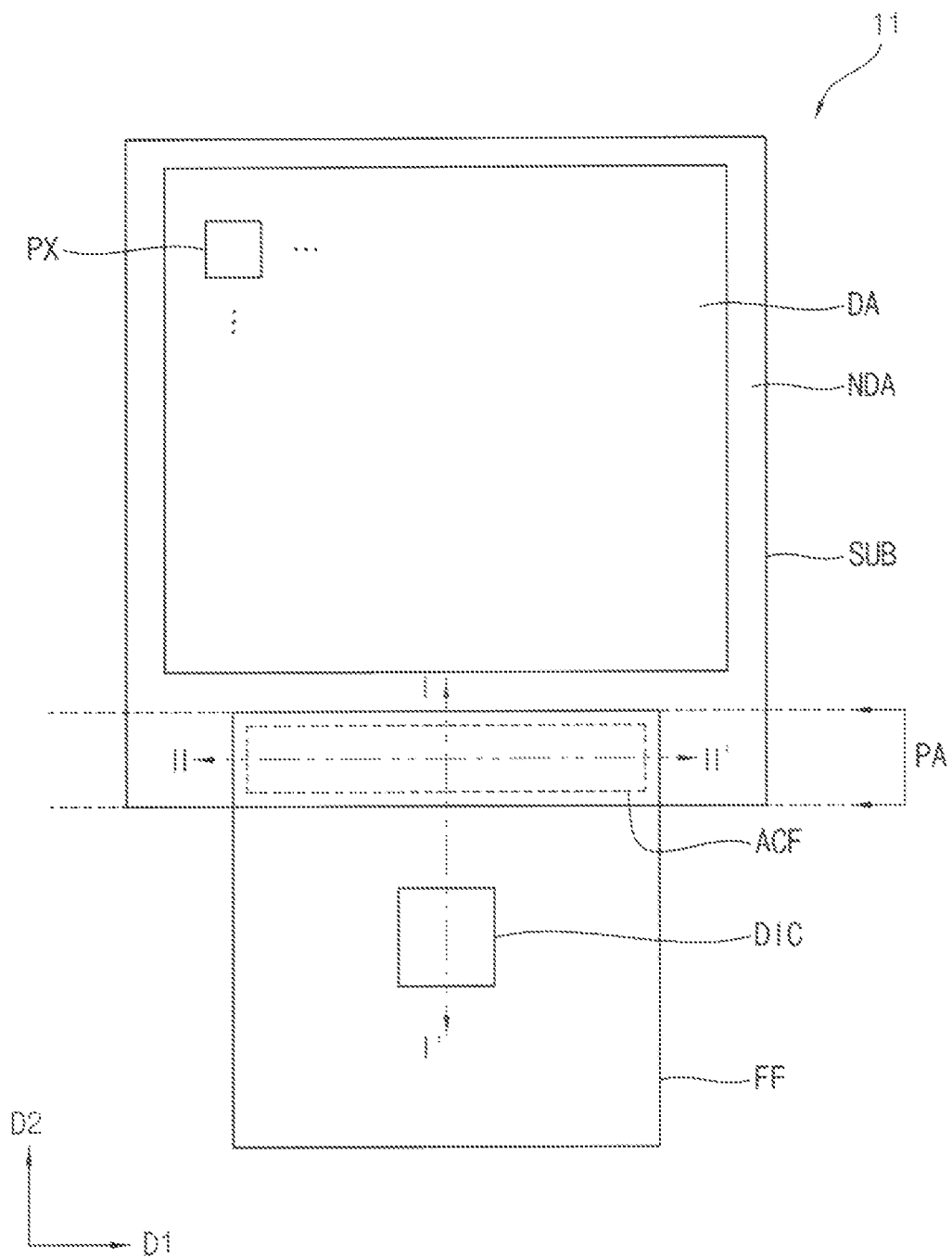
FIG. 1 is a plan view illustrating a display device according to an embodiment.

FIG. 1 is a plan view illustrating a display device 11 according to an embodiment. A first direction D1 and a second direction D2 crossing the first direction D1 may define a plane.

Referring to FIG. 1, the display device 11 may include a substrate SUB, a plurality of pixels PX, a flexible film FF, an anisotropic conductive film ACF, and a driving chip DIC. The display device 11 may have a display area DA and a pad area PA. The display device 11 may further have a non-display area NDA that surrounds the display area DA. For example, the pad area PA may be included in the non-display area NDA. FIG. 1 illustrates the substrate SUB and the flexible film FF in a rectangular shape, but the present disclosure is not limited thereto. The substrate SUB and the flexible film FF may have various shapes. For example, the substrate SUB and the flexible film FF may have a shape whose width is narrowed at the bottom.

The plurality of pixels PX may be disposed in the display area DA. The plurality of pixels PX may be arranged in the display area DA in a matrix form. However, this is only a non-limiting example, and the plurality of pixels PX may be arranged in various forms in the display area DA. The display device 11 may display an image in the display area DA using the plurality of pixels PX arranged therein. The display device 11 may be an organic light emitting display device. However, this is only a non-limiting example, and the display device 11 may be a liquid crystal display device, an electrophoretic display device, a plasma display device, a quantum dot display device, or the like.

In an embodiment, one or more drivers (e.g. a gate driver and/or a data driver) may be disposed in the non-display area NDA.

The flexible film FF may be disposed on the substrate SUB. In more detail, a portion of the flexible film FF may overlap the pad area PA of the substrate SUB.

The driving chip DIC may control signals and voltages provided to the plurality of pixels PX. The driving chip DIC may be disposed on the flexible film FF. In this case, the driving chip DIC may have a chip-on-film structure. However, this is only a non-limiting example. Unlike the illustrated in FIG. 1, the substrate SUB may be a glass substrate, and the driving chip DIC may be directly disposed on the substrate SUB. In this case, the driving chip DIC may have a chip-on-glass structure. In another example, the substrate SUB may be a plastic substrate (e. g. the substrate SUB includes polyimide), and the driving chip DIC may be directly disposed on the substrate SUB. In this case, the driving chip DIC may have a chip-on-plastic structure. In some embodiments, the flexible film FF may be omitted, and the driving chip DIC may be directly disposed on the substrate SUB. In this case, the anisotropic conductive film ACF may be disposed between the driving chip DIC and the substrate SUB. Hereinafter, the embodiment of the driving chip DIC having the chip-on-film structure will be described in detail.

The anisotropic conductive film ACF may be disposed between the substrate SUB and the flexible film FF. In more detail, the anisotropic conductive film ACF may be disposed between a pad electrode disposed on the substrate SUB and a bump electrode included the flexible film FF. The anisotropic conductive film ACF may be in a form of a double-sided tape in which an adhesive that is curable by heat and conductive balls dispersed in the adhesive are mixed. When a pressure is applied to the anisotropic conductive film ACF, the conductive balls in a portion where the pad electrode on the substrate SUB and the bump electrode of the flexible film FF contact each other may be destroyed. The destroyed conductive balls may electrically connect the pad electrode and the bump electrode. Thereafter, the adhesive may be cured by applying high temperature heat to the anisotropic conductive film ACF so that the conductive balls are fixed. Accordingly, the anisotropic conductive film ACF may adhere the substrate SUB and the flexible film FF to each other, and the pad electrode, the bump electrode, and the driving chip DIC may be electrically connected to one another through the anisotropic conductive film ACF.

Figure 2:
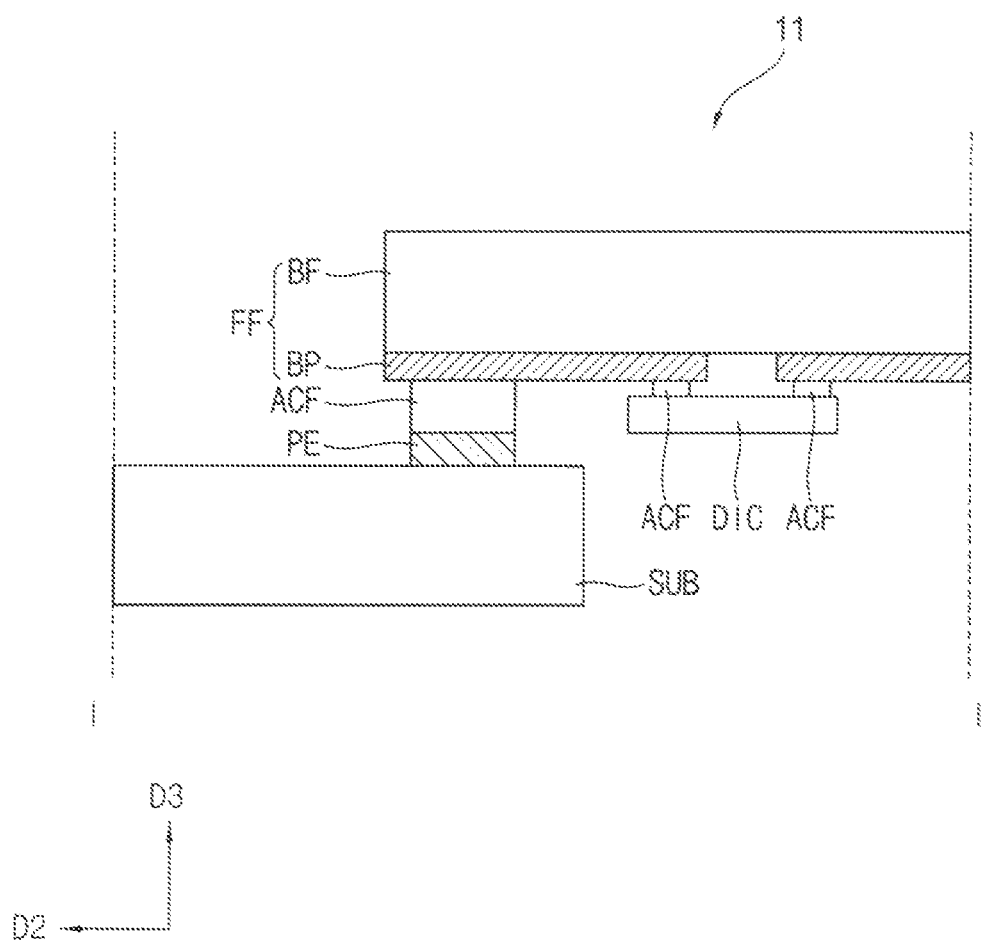
FIG. 2 is a cross-sectional view taken along line I-I' of FIG. 1.

FIG. 2 is a cross-sectional view taken along line I-I' of FIG. 1. A third direction D3 may cross the second direction D2. Specifically, the third direction D3 may be perpendicular to the plane defined by the first direction D1 and the second direction D2.

Referring to FIG. 2, the display device 11 may include the substrate SUB, a plurality of pad electrodes PE, the anisotropic conductive film ACF, the flexible film FF, and the driving chip DIC.

The substrate SUB may include a transparent material. In one embodiment, the substrate SUB may be a glass substrate, a quartz substrate, a synthetic quartz substrate, a calcium fluoride substrate, a fluorine-doped quartz substrate, a soda lime glass substrate, a non-alkali glass substrate, or the like. In another embodiment, the substrate SUB may be a flexible transparent plastic substrate. For example, the substrate SUB may include polyimide. Accordingly, light may pass through the substrate SUB. For example, when light is irradiated from a bottom of the substrate SUB upwardly toward the substrate SUB in the third direction D3, the light may pass through the substrate SUB without being blocked or reflected by the substrate SUB.

The plurality of pad electrodes PE may be disposed on the pad area PA of the substrate SUB. Although FIG. 2 illustrates only one pad electrodes PE, it is understood that the number of the plurality of pad electrodes PE is not limited thereto. That is, there may be several pad electrodes PE. The plurality of pad electrodes PE may include metal oxide. Examples of the metal oxide may include, but are not limited to, indium-tin-oxide, indium-zinc-oxide, and indium-zinc-tin-oxide. These may be used alone or in any combination. However, the present disclosure is not limited thereto, and the plurality of pad electrodes PE may include various materials having electrical conductivity without deviating from the scope of the present disclosure.

The flexible film FF may include a base film BF and a plurality of bump electrodes BP. The base film BF may include plastic. In one embodiment, the base film BF may include polyimide. The base film BF may include various materials having flexible, bendable, or rollable characteristic. The plurality of bump electrodes BP may be disposed on (or under according to the orientation of the illustration in FIG. 2) the base film BF. The plurality of bump electrodes BP may include metal. Examples of the metal may include, but are not limited to, copper and gold. These may be used alone or in any combination. However, the present disclosure is not limited thereto, and the plurality of bump electrodes BP may include various metals without deviating from the scope of the present disclosure.

The driving chip DIC may be disposed on (or under) the flexible film FF. However, the present disclosure is not limited thereto. For example, as described above, the driving chip DIC may be disposed on the flexible film FF.

The anisotropic conductive film ACF may be disposed between two media to connect them. Here, bonding may refer to electrically connecting the two media. Accordingly, the anisotropic conductive film ACF may be disposed between each of the plurality of pad electrodes PE and a corresponding one of the plurality of bump electrodes BP. Further, the anisotropic conductive film ACF may be disposed between the flexible film FF and the driving chip DIC. The plurality of pad electrodes PE and the plurality of bump electrodes BP may be electrically connected, and the flexible film FF and the driving chip DIC may be electrically connected through the anisotropic film ACF. In more detail, the plurality of bump electrodes BP may be electrically connected to the corresponding ones of the plurality of pad electrodes PE respectively. In the case of the above described the chip-on-glass structure or the chip-on-plastic structure, the flexible film FF may be omitted. In these cases, the anisotropic conductive film ACF may be disposed between the plurality of pad electrodes PE disposed on the substrate SUB and the plurality of bump electrodes BP included in the driving chip DIC. Accordingly, the plurality of pad electrodes PE, the plurality of bump electrodes BP, and the driving chip DIC may be electrically connected through the anisotropic conductive film ACF.

The anisotropic conductive film ACF may include a resin and conductive balls. The resin may include a thermosetting resin, and the conductive balls may include a conductive material. The conductive balls may serve to electrically connect two media to be bonded. The resin may serve to fix the conductive balls and may serve to attach the two media. The resin may be cured by heating. Initially, the anisotropic conductive film ACF is disposed between the two media to be electrically connected, and then the anisotropic conductive film ACF is heated and pressed. The conductive balls dispersed in the anisotropic conductive film ACF are connected between two facing electrodes (e.g., a pad electrode PE and a bump electrode BP) to impart conductivity, and the resin of the anisotropic conductive film ACF is melted and bonded between the facing electrodes.

Conventionally, when bonding two media using an anisotropic conductive film, a hot bar is required because a constant temperature, pressure, and time must be given due to characteristics of a thermosetting resin of the anisotropic conductive film. A method of transferring heat by pressing the hot bar on a contact surface of the two media may be used. In other words, in the heat transfer process using the hot bar, the anisotropic conductive film may be attached between two surfaces of the two media to be bonded. The thermosetting resin may be cured over time by applying heat to the media while pressing the hot bar at a constant pressure. As a result, the two contact surfaces adhere to each other, and electricity flows through the conductive balls dispersed in the anisotropic conductive film. However, in the method of transferring heat by the hot bar, it is difficult to uniformize the temperature of the entire the hot bar. In addition, heat conversion efficiency is low because energy consumption is large in portions other than the bonding portion. Further, the surface of the hot bar may be contaminated after repetitive uses, it would be difficult to secure reproducibility. Also, there is a problem that a quality of bonding may depend on experience and skill of an operator. Therefore, in a case where an anisotropic conductive film is used to bond two media, a method of transferring heat by laser has been developed to replace the method of transferring heat by a hot bar.

According to one embodiment, heat is transferred to cure the anisotropic conductive film ACF by irradiating the laser. The laser may be light in an infrared light range. Heat transferred by laser may apply a uniform temperature to a desired location. Therefore, the method of transferring heat by laser may solve the aforementioned problems of the method of transferring heat by a hot bar.

Figure 3:
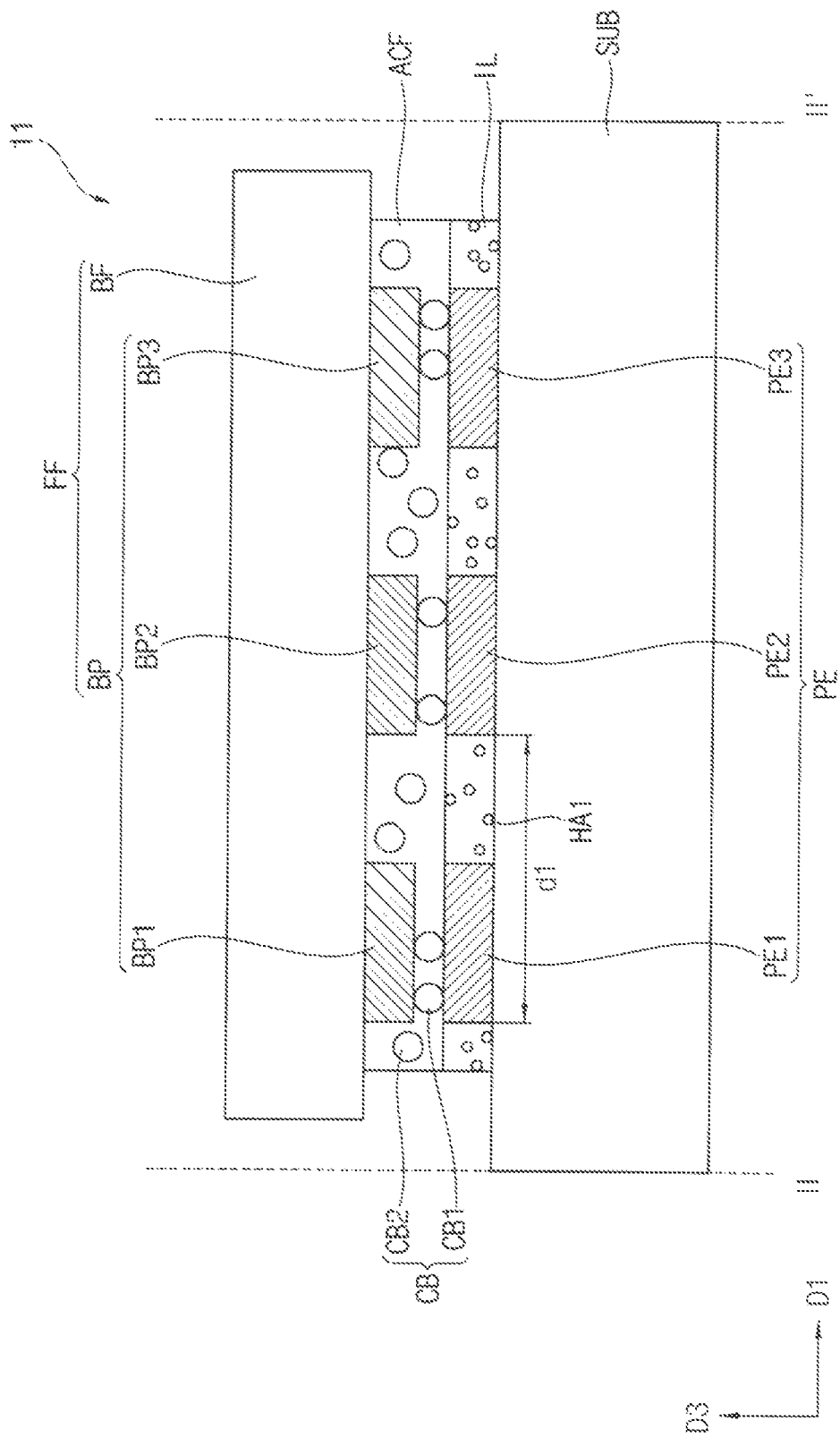
FIG. 3 is a cross-sectional view taken along line II-II' of FIG. 1.

FIG. 3 is a cross-sectional view taken along line II-II' of FIG. 1.

Referring to FIG. 3, the display device 11 may include the substrate SUB, the plurality of pad electrodes PE, an insulating layer IL, the anisotropic conductive film ACF, and the flexible film FF.

The substrate SUB may include a transparent material. For example, the substrate SUB may be a glass substrate. When light is irradiated from a bottom of the substrate SUB upwardly toward the substrate SUB in the third direction D3, the light may pass through the substrate SUB without being blocked or reflected by the substrate SUB. In other words, the light may pass through the substrate SUB and may reach the plurality of pad electrodes PE, the insulating layer IL, the anisotropic conductive film ACF, and the flexible film FF.

The plurality of pad electrodes PE may be disposed in the pad area PA of the substrate SUB. Although FIG. 3 illustrates three pad electrodes PE1, PE2, and PE3, the number of the plurality of pad electrodes PE is not limited thereto. For example, there may be dozens of pad electrodes PE. The plurality of pad electrodes PE may include indium-tin-oxide. However, this is only a non-limiting example, and the plurality of pad electrodes PE may include various conductive materials without deviating from the scope of the present disclosure. For example, the plurality of pad electrodes PE may include at least one selected from a group consisting of indium-tin-oxide, indium-zinc-oxide, and indium-zinc-tin-oxide.

A pitch d1 of the pad electrodes PE may be about 26 μm or less. As a relatively large number of the pad electrodes PE are disposed in a limited space of the display device 11, the pitch d1 of the plurality of pad electrodes PE may decrease accordingly. For example, the pitch d1 of the plurality of pad electrodes PE may about 20 μm, about 18 μm, about 15 μm, or the like.

The insulating layer IL may be disposed on the substrate SUB and may disposed between adjacent ones of the pad electrodes PE1, PE2, and PE3. The insulating layer IL may cover a side surface of each of the plurality of pad electrodes PE. Accordingly, the insulating layer IL may serve to insulate the pad electrodes PE1, PE2, and PE3. The insulating layer IL may include a first heat absorbing particle HA1. The first heat absorbing particle HA1 may be dispersed in the insulating layer IL. The first heat absorbing particle HA1 may absorb light in an infrared light range. In one embodiment, the first heat absorbing particle HA1 may absorb light having a wavelength of about 808 nm. The first heat absorbing particle HA1 may be a metal particle or a metal oxide particle. That is, the first heat absorbing particle HA1 may include metal or metal oxide. Examples of the metal or metal oxide may include, but are not limited to, tungsten oxide ($WO_3$), vanadium oxide ($V_2O_5$), iron oxide ($Fe_2O_5$), carbon nanotube, tellurium oxide ($TeO_2$), zinc oxide (ZnO), barium oxide (BaO), niobium oxide ($Nb_2O5$), aluminum oxide ($Al_2O_3$), manganese oxide ($MnO_2$), aluminum (Al), and iron (Fe). These may be used alone or in any combination. However, the present disclosure is not limited thereto, and the first heat absorbing particle HA1 may be a particle including various materials absorbing light in the infrared light range without deviating from the scope of the present disclosure. Accordingly, when an infrared laser is irradiated from the lower portion of the substrate SUB upwardly toward the third direction D3, most of the infrared laser may be absorbed by the first heat absorbing particle HA1.

A display panel may include the substrate SUB, the plurality of pad electrodes PE, and the insulating layer IL that includes the first heat absorbing particle HA1.

The anisotropic conductive film ACF may be disposed on the plurality of pad electrodes PE and the insulating layer IL. The anisotropic conductive film ACF may include a conductive ball CB. Accordingly, the anisotropic conductive film ACF may electrically connect the plurality of pad electrodes PE and the plurality of bump electrodes BP. The conductive ball CB may include a first conductive ball CB1 in contact with at least one of the plurality of pad electrodes PE and a second conductive ball CB2 not in contact with any of the plurality of pad electrodes PE. This will be described later in further detail with respect to FIG. 7.

The flexible film FF may include the base film BF and the plurality of bump electrodes BP that are electrically connected to the plurality of pad electrodes PE. The flexible film FF may be disposed on the anisotropic conductive film ACF. Accordingly, the anisotropic conductive film ACF may be disposed between the plurality of pad electrodes PE and the flexible film FF.

The plurality of bump electrodes BP may be disposed on the plurality of pad electrodes PE. In the present example, each of the plurality of bump electrodes BP1, BP2, and BP3 may be disposed facing each other to correspond to each of the plurality of pad electrodes PE1, PE2, and PE3. Although FIG. 3 illustrates three bump electrodes BP, the number of the plurality of bump electrodes BP is not limited thereto. For example, the number of the plurality of bump electrodes BP may be dozens. The number of the plurality of bump electrodes BP may correspond to the number of the plurality of pad electrodes PE. The plurality of bump electrodes BP may include various metals. Examples of the metal may include, but are not limited to, copper and gold. These may be used alone or in any combination. In addition, although FIG. 3 illustrates that the plurality of bump electrodes BP are included in the flexible film FF as a non-limiting example case of the above described the chip-on-glass structure or the chip-on-plastic structure, the flexible film FF may be omitted. In this case, the flexible film FF including the plurality of bump electrodes BP may be replaced with a driving chip DIC that includes the plurality of bump electrodes BP. In other words, the plurality of bump electrodes BP of the driving chip DIC may be disposed on the plurality of pad electrodes PE.

The plurality of bump electrodes BP may be disposed on the base film BF. The base film BF may include a plastic film. The base film BF may have flexible, bendable, or rollable characteristics. In one embodiment, the base film BF may include polyimide.

Meanwhile, the plurality of pad electrodes PE may need to be arranged within a limited space of the display device 11. To achieve the tight arrangement of the plurality of pad electrodes PE, ultra-fine pitch bonding that reduces the pitch d1 of the plurality of pad electrodes PE may be used.

A laser (e.g., infrared laser) is irradiated to the anisotropic conductive film ACF to bond the substrate SUB and the flexible film FF, and the anisotropic conductive film ACF is cured with heat generated by the laser. The anisotropic conductive film ACF may generate heat by absorbing the laser. However, the amount of heat generated by direct absorption of the laser by the anisotropic conductive film ACF may be relatively small. Accordingly, the anisotropic conductive film ACF may be cured by heat generated by absorbing the laser by the plurality of pad electrodes PE, the conductive ball CB, the plurality of bump electrodes BP, and/or the base film BF. However, since the base film BF contains a polymer resin such as polyimide, the base film BF may expand by heat generated by absorbing the laser. In other words, the base film BF may be stretched when it absorbs more heat than a critical amount. As the base film BF is stretched, positions of the plurality of bump electrodes BP1, BP2, and BP3 may be changed to cause misalignment between the bump electrodes BP1, BP2, and BP3 and the pad electrodes PE1, PE2, and PE3. Accordingly, as the pitch d1 of the plurality of pad electrodes PE is reduced in ultra-fine pitch bonding, a short circuit may occur due to the stretching of the base film BF. Therefore, it is desirable to minimize the amount of stretching of the base film BF to improve the ultra-fine pitch bonding. For example, the laser may be irradiated from the lower portion of the substrate SUB for ultra-fine pitch bonding so that the base film BF may absorb a relatively small amount of heat generated by the laser, and the anisotropic conductive film ACF may absorb a relatively large amount of heat generated by the laser.

As described above, the display device 11 may include the first heat absorbing particle HA1. The first heat absorbing particle HA1 may be dispersed in the insulating layer IL. The first heat absorbing particle HA1 may absorb light in an infrared light range. In one embodiment, the first heat absorbing particle HA1 may absorb light having a wavelength of about 808 nm. The first heat absorbing particle HA1 may be a metal particle or a metal oxide particle. Examples of the metal or metal oxide may include, but are not limited to, tungsten oxide, vanadium oxide, iron oxide, carbon nanotube, tellurium oxide, zinc oxide, barium oxide, niobium oxide, aluminum oxide, manganese oxide, aluminum, and iron. These may be used alone or in any combination. However, the present disclosure is not limited thereto, and the first heat absorbing particle HA1 may be a particle including various materials absorbing light in the infrared light range without deviating from the scope of the present disclosure. According to one embodiment, the infrared laser may be irradiated from the lower portion of the substrate SUB upwardly toward the third direction D3 so that most of the laser may be absorbed by the first heat absorbing particle HA1, thereby minimizing the amount of stretching of the base film BF.

Since the first heat absorbing particle HA1 mostly absorbs the laser, the insulating layer IL including the first heat absorbing particle HA1 may have the highest temperature. The anisotropic conductive film ACF may be cured by receiving heat from the insulating layer IL. In addition, the first heat absorbing particle HA1 may reduce the amount of laser reaching the base film BF. Therefore, the base film BF may be maintained at a relatively low temperature, and the amount of stretching of the base film BF may be reduced to provide an alignment accuracy adequate for ultra-fine pitch bonding.

Figure 4:
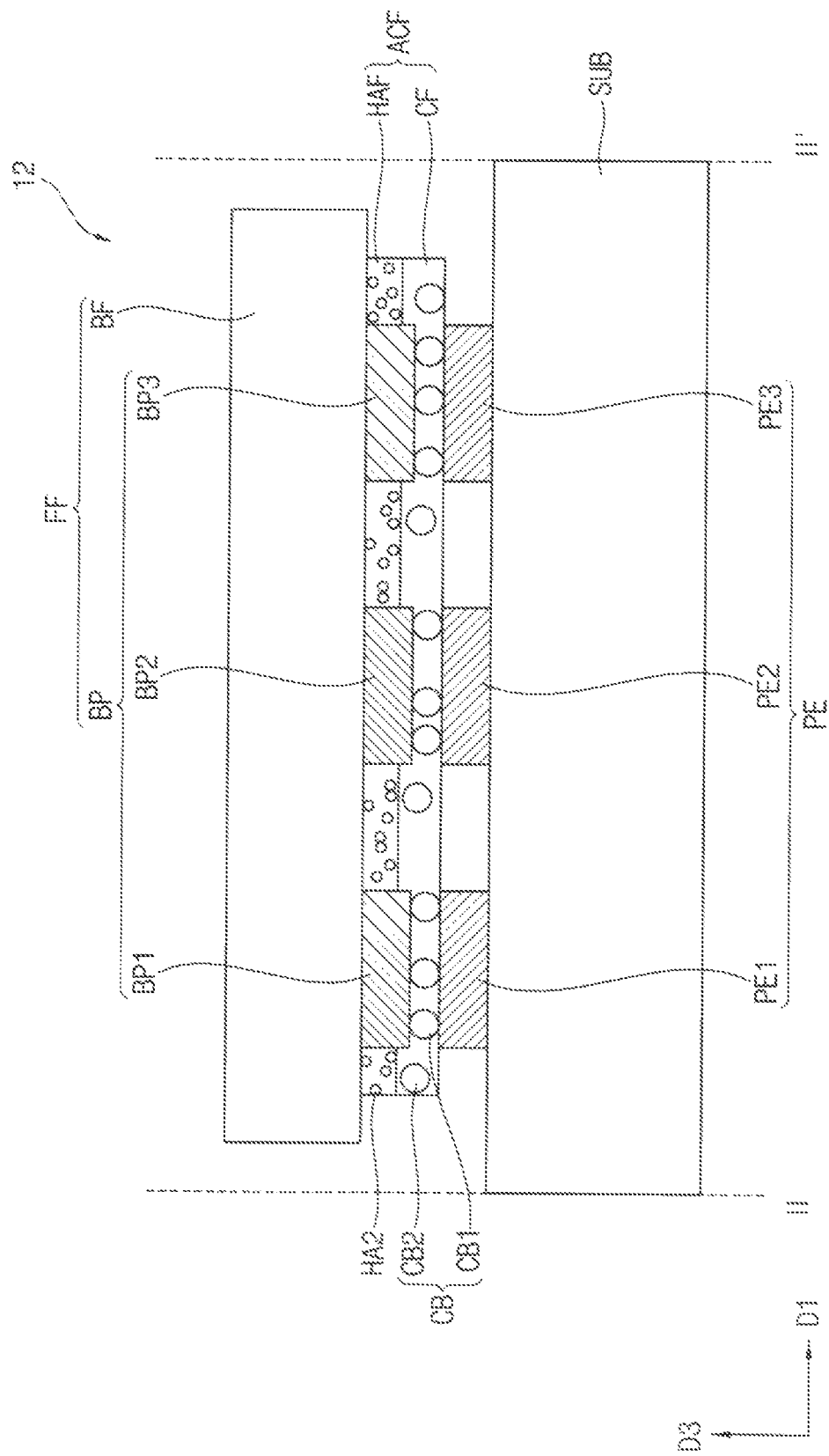
FIG. 4 is a cross-sectional view illustrating a display device according to another embodiment.

FIG. 4 is a cross-sectional view illustrating a display device 12 according to an embodiment.

Referring to FIG. 4, the display device 12 may include the substrate SUB, the plurality of pad electrodes PE, an anisotropic conductive film ACF, and the flexible film FF.

The anisotropic conductive film ACF may be disposed on the plurality of pad electrodes PE. The anisotropic conductive film ACF may be disposed between the plurality of pad electrodes PE and the flexible film FF. The anisotropic conductive film ACF may include a conductive ball CB. Accordingly, the anisotropic conductive film ACF may electrically connect the plurality of pad electrodes PE and the plurality of bump electrodes BP. In the present embodiment, the anisotropic conductive film ACF may include a conductive layer CF and a heat absorbing layer HAF. The conductive layer CF may be disposed between the plurality of pad electrodes PE and the plurality of bump electrodes BP, and may include the conductive ball CB. The heat absorbing layer HAF may be disposed between adjacent ones of the plurality of bump electrodes BP and may include a second heat absorbing particle HA2. In other words, the anisotropic conductive film ACF may have a two-layer structure that includes the conductive layer CF including the conductive ball CB and the heat absorbing layer HAF not including the conductive ball CB. The conductive ball CB may include a first conductive ball CB1 in contact with at least one of the plurality of pad electrodes PE and a second conductive ball CB2 not in contact with any of the plurality of pad electrodes PE. This will be described later in further detail with respect to FIG. 7.

The display device 12 may include the second heat absorbing particle HA2. For example, the heat absorbing layer HAF included in the anisotropic conductive film ACF of the display device 12 may include the second heat absorbing particle HA2. The second heat absorbing particle HA2 may be dispersed in the heat absorbing layer HAF. The second heat absorbing particle HA2 may absorb light in an infrared light range. In one embodiment, the second heat absorbing particle HA2 may absorb light having a wavelength of about 808 nm. The second heat absorbing particle HA2 may be a metal particle or a metal oxide particle. That is, the second heat absorbing particle HA2 may include metal or metal oxide. Examples of the metal or metal oxide may include, but are not limited to, tungsten oxide, vanadium oxide, iron oxide, carbon nanotube, tellurium oxide, zinc oxide, barium oxide, niobium oxide, aluminum oxide, manganese oxide, aluminum, and iron. These may be used alone or in any combination. However, the present disclosure is not limited thereto, and the second heat absorbing particle HA2 may be a particle including various materials absorbing light in the infrared light range without deviating from the scope of the present disclosure. Accordingly, when the infrared laser is irradiated from the lower portion of the substrate SUB upwardly toward the third direction D3, most of the laser may be absorbed by the second heat absorbing particle HA2.

Since the second heat absorbing particle HA2 mostly absorbs the laser, the heat absorbing layer HAF including the second heat absorbing particle HA2 may have the highest temperature. The anisotropic conductive film ACF may be cured by receiving heat from the heat absorbing layer HAF. In addition, the second heat absorbing particle HA2 may reduce the amount of laser reaching the base film BF. Since the base film BF may be maintained at a relatively low temperature, the amount of stretching of the base film BF may be reduced to provide an alignment accuracy adequate for ultra-fine pitch bonding.

Although FIG. 4 illustrates that the plurality of bump electrodes BP are included in the flexible film FF, as a non-limiting example case of the above described the chip-on-glass structure or the chip-on-plastic structure, the flexible film FF may be omitted. In this case, the flexible film FF including the plurality of bump electrodes BP may be replaced with the driving chip DIC that includes the plurality of bump electrodes BP. In other words, the anisotropic conductive film ACF may be disposed between the plurality of pad electrodes PE and the driving chip DIC.

Figure 5:
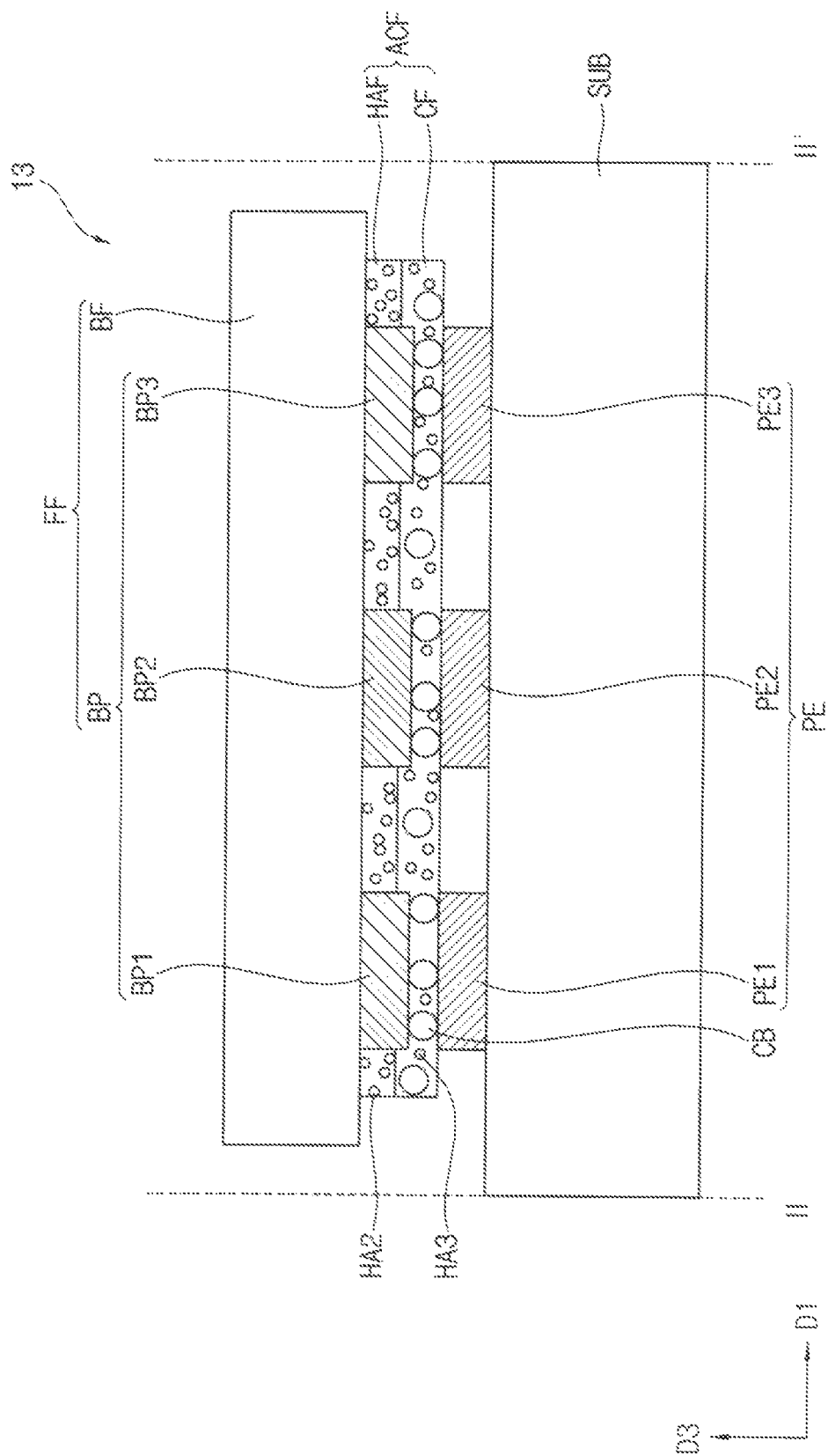
FIG. 5 is a cross-sectional view illustrating a display device according to yet another embodiment.

FIG. 5 is a cross-sectional view illustrating a display device 13 according to an embodiment.

Referring to FIG. 5, the display device 13 may include the substrate SUB, the plurality of pad electrodes PE, an anisotropic conductive film ACF, and the flexible film FF.

The anisotropic conductive film ACF may be disposed on the plurality of pad electrodes PE. The anisotropic conductive film ACF may be disposed between the plurality of pad electrodes PE and the flexible film FF. The anisotropic conductive film ACF may include a conductive ball CB. Accordingly, the anisotropic conductive film ACF may electrically connect the plurality of pad electrodes PE and the plurality of bump electrodes BP. The anisotropic conductive film ACF may include a conductive layer CF and a heat absorbing layer HAF. The conductive layer CF may be disposed between the plurality of pad electrodes PE and the plurality of bump electrodes BP, and may include the conductive ball CB. The heat absorbing layer HAF may be disposed between adjacent ones of the plurality of bump electrodes BP and may include a second heat absorbing particle HA2. In other words, the anisotropic conductive film ACF may have a two-layer structure that includes the conductive layer CF including the conductive ball CB and the heat absorbing layer HAF not including the conductive ball CB.

The display device 13 may include a second heat absorbing particle HA2 and a third heat absorbing particle HA3. For example, the heat absorbing layer HAF included in the anisotropic conductive film ACF of the display device 13 may include the second heat absorbing particle HA2, and the conductive layer CF included the anisotropic conductive film ACF may include the third heat absorbing particle HA3. In other words, the second heat absorbing particle HA2 may be dispersed in the heat absorbing layer HAF, and the third heat absorbing particle HA3 may be dispersed in the conductive layer CF. The second heat absorbing particle HA2 and the third heat absorbing particle HA3 may absorb light in an infrared light range. In one embodiment, the second heat absorbing particle HA2 and the third heat absorbing particle HA3 may absorb light having a wavelength of about 808 nm. The second heat absorbing particle HA2 and the third heat absorbing particle HA3 may be a metal particle or a metal oxide particle. That is, the second heat absorbing particle HA2 and the third heat absorbing particle HA3 may include metal or metal oxide. Examples of the metal or metal oxide may include, but are not limited to, tungsten oxide, vanadium oxide, iron oxide, carbon nanotube, tellurium oxide, zinc oxide, barium oxide, niobium oxide, aluminum oxide, manganese oxide, aluminum, and iron. These may be used alone or in any combination. However, the present disclosure is not limited thereto, and the second heat absorbing particle HA2 and the third heat absorbing particle HA3 may be particles including various materials absorbing light in the infrared light range without deviating from the scope of the present disclosure. Accordingly, when the infrared laser is irradiated from the lower portion of the substrate SUB upwardly toward the third direction D3, most of the laser may be absorbed by the second heat absorbing particle HA2 and the third heat absorbing particle HA3.

Since the second heat absorbing particle HA2 and the third heat absorbing particle HA3 mostly absorb the laser, the heat absorbing layer HAF including the second heat absorbing particle HA2 and the conductive layer CF including the third heat absorbing particle HA3 may have high temperatures. The anisotropic conductive film ACF may be cured by receiving heat from the heat absorbing layer HAF and the conductive layer CF. In addition, the second heat absorbing particle HA2 and the third heat absorbing particle HA3 may reduce the amount of laser reaching the base film BF. Since the base film BF may be maintained at a relatively low temperature, the amount of stretching of the base film BF may be reduced to provide an alignment accuracy adequate for ultra-fine pitch bonding.

Although FIG. 5 illustrates that the plurality of bump electrodes BP are included in the flexible film FF, as a non-limiting example case of the above described the chip-on-glass structure or the chip-on-plastic structure, the flexible film FF may be omitted. In this case, the flexible film FF including the plurality of bump electrodes BP may be replaced with the driving chip DIC that includes the plurality of bump electrodes BP. In other words, the anisotropic conductive film ACF may be disposed between the plurality of pad electrodes PE and the driving chip DIC.

Figure 6:
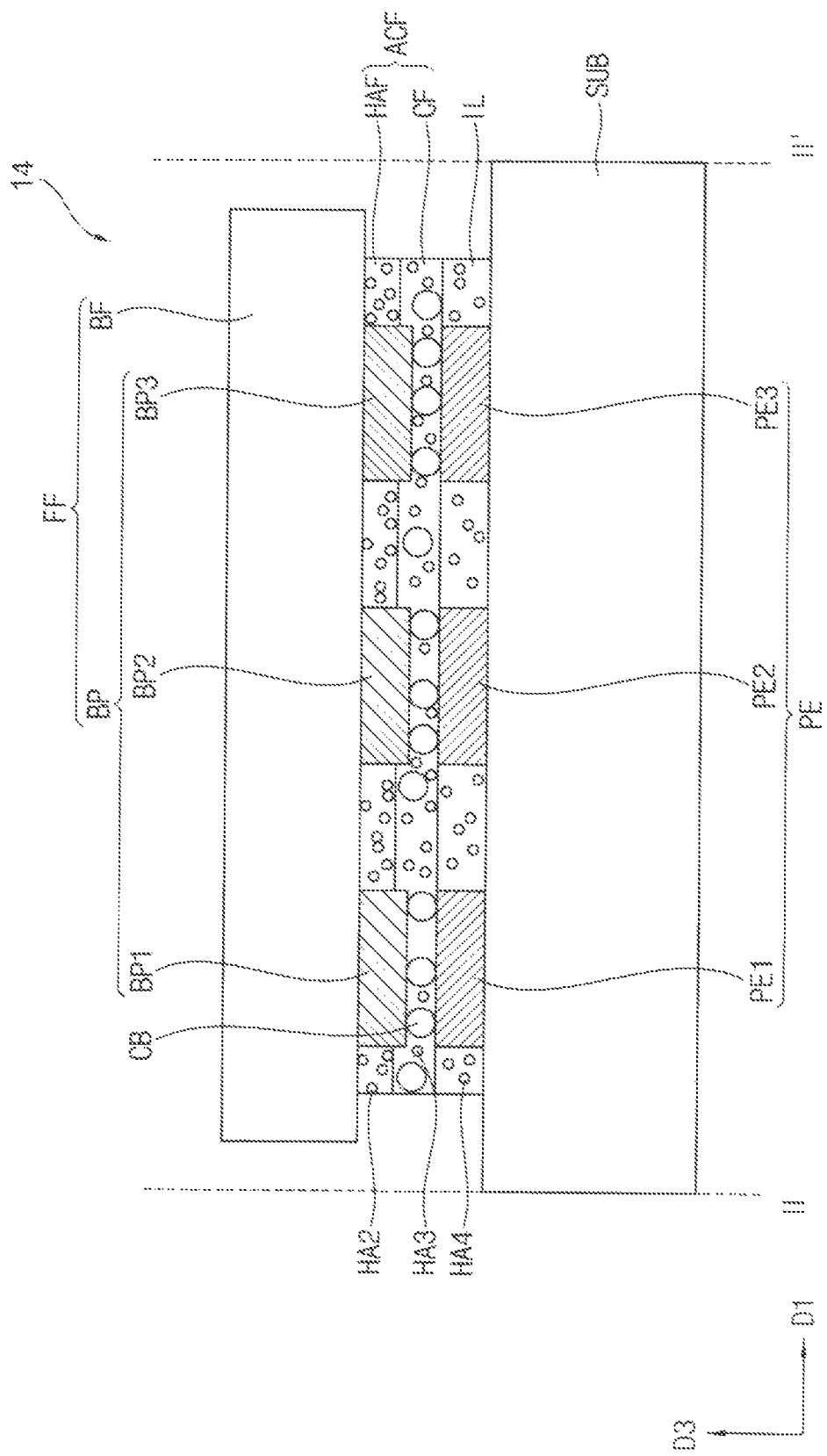
FIG. 6 is a cross-sectional view illustrating a display device according to yet another embodiment.

FIG. 6 is a cross-sectional view illustrating a display device 14 according to an embodiment.

Referring to FIG. 6, the display device 14 may include the substrate SUB, the plurality of pad electrodes PE, an insulating layer IL, an anisotropic conductive film ACF, and the flexible film FF.

The insulating layer IL may be disposed on the substrate SUB and may disposed between adjacent ones of the plurality of pad electrodes PE1, PE2, and PE3. The insulating layer IL may cover a side surface of each of the plurality of pad electrodes PE. Accordingly, the insulating layer IL may serve to insulate the plurality of pad electrodes PE1, PE2, and PE3.

The anisotropic conductive film ACF may be disposed on the plurality of pad electrodes PE and the insulating layer IL. The anisotropic conductive film ACF may be disposed between the plurality of pad electrodes PE and the flexible film FF. The anisotropic conductive film ACF may include a conductive ball CB. Accordingly, the anisotropic conductive film ACF may electrically connect the plurality of pad electrodes PE and the plurality of bump electrodes BP. The anisotropic conductive film ACF may include a conductive layer CF and a heat absorbing layer HAF. The conductive layer CF may be disposed between the plurality of pad electrodes PE and the plurality of bump electrodes BP, and may include the conductive ball CB. The heat absorbing layer HAF may be disposed between adjacent ones of the plurality of bump electrodes BP and may include a second heat absorbing particle HA2. In other words, the anisotropic conductive film ACF may have a two-layer structure that includes the conductive layer CF including the conductive ball CB and the heat absorbing layer HAF not including the conductive ball CB.

The display device 14 may include the second heat absorbing particle HA2, a third heat absorbing particle HA3, and a fourth heat absorbing particle HA4. For example, the heat absorbing layer HAF included in the anisotropic conductive film ACF of the display device 14 may include the second heat absorbing particle HA2, the conductive layer CF included the anisotropic conductive film ACF may include the third heat absorbing particle HA3, and the insulating layer IL may include the fourth heat absorbing particle HA4. In other words, the second heat absorbing particle HA2 may be dispersed in the heat absorbing layer HAF, the third heat absorbing particle HA3 may be dispersed in the conductive layer CF, and the fourth heat absorbing particle HA4 may be dispersed in the insulating layer IL. The second heat absorbing particle HA2, the third heat absorbing particle HA3, and the fourth heat absorbing particle HA4 may absorb light in an infrared light range. In one embodiment, the second heat absorbing particle HA2, the third heat absorbing particle HA3, and the fourth heat absorbing particle HA4 may absorb light having a wavelength of about 808 nm. The second heat absorbing particle HA2, the third heat absorbing particle HA3, and the fourth heat absorbing particle HA4 may be a metal particle or a metal oxide particle. That is, the second heat absorbing particle HA2, the third heat absorbing particle HA3, and the fourth heat absorbing particle HA4 may include metal or metal oxide. Examples of the metal or metal oxide may include, but are not limited to, tungsten oxide, vanadium oxide, iron oxide, carbon nanotube, tellurium oxide, zinc oxide, barium oxide, niobium oxide, aluminum oxide, manganese oxide, aluminum, and iron. These may be used alone or in any combination. However, the present disclosure is not limited thereto, and the second heat absorbing particle HA2, the third heat absorbing particle HA3, and the fourth heat absorbing particle HA4 may be particles including various materials absorbing light in the infrared light range without deviating from the scope of the present disclosure. Accordingly, when the infrared laser is irradiated from the lower portion of the substrate SUB upwardly toward the third direction D3, most of the laser may be absorbed by the second heat absorbing particle HA2, the third heat absorbing particle HA3, and the fourth heat absorbing particle HA4.

Since the second heat absorbing particle HA2, the third heat absorbing particle HA3, and the fourth heat absorbing particle HA4 mostly absorb the laser, the heat absorbing layer HAF including the second heat absorbing particle HA2, the conductive layer CF including the third heat absorbing particle HA3, and the insulating layer IL including the fourth heat absorbing particle HA4 may have high temperatures. The anisotropic conductive film ACF may be cured by receiving heat from the heat absorbing layer HAF, the conductive layer CF, and the insulating layer IL. In addition, the second heat absorbing particle HA2, the third heat absorbing particle HA3, and the fourth heat absorbing particle HA4 may reduce the amount of laser reaching the base film BF. Since the base film BF may be maintained at a relatively low temperature, the amount of stretching of the base film BF may be reduced to provide an alignment accuracy adequate for ultra-fine pitch bonding.

Although FIG. 6 illustrates that the plurality of bump electrodes BP are included in the flexible film FF, as a non-limiting example case of the above described the chip-on-glass structure or the chip-on-plastic structure, the flexible film FF may be omitted. In this case, the flexible film FF including the plurality of bump electrodes BP may be replaced with the driving chip DIC including the plurality of bump electrodes BP. In other words, the anisotropic conductive film ACF may be disposed between the plurality of pad electrodes PE and the driving chip DIC.

FIG. 7 is a cross-sectional view of a conductive layer CF according to an embodiment.

Referring to FIG. 7, the conductive layer CF may include a conductive ball CB. A diameter t1 of the conductive ball CB may be about 3.2 µm. A thickness t2 of the conductive layer CF may be less than about twice the diameter t1 of the conductive ball CB. For example, the thickness t2 of the conductive layer CF is about 3.2 µm to about 6.4 µm. However, the diameter t1 of the conductive ball CB is not limited thereto, and the conductive ball CB may have various sizes without deviating from the scope of the present disclosure. Similarly, the thickness t2 of the conductive layer CF is not limited thereto, and the conductive layer CF may have various thicknesses without deviating from the scope of the present disclosure. The thickness t2 of the conductive layer CF may be about twice or less than the diameter t1 of the conductive ball CB.

An even pressure may be applied to bond the two media disposed on opposite sides of the anisotropic conductive film ACF.

Referring to FIGS. 3, 4, and 7, the first conductive ball CB1 may be disposed between the plurality of pad electrodes PE and the plurality of bump electrodes BP, and the second conductive ball CB2 may not be disposed between the plurality of pad electrodes PE and the plurality of bump electrodes BP. Therefore, the second conductive ball CB2 that is not disposed between the plurality of pad electrodes PE and the plurality of bump electrodes BP may not be able to electrically connect the substrate SUB and the flexible film FF.

A movement of the first conductive ball CB1 to the second conductive ball CB2 may be defined as a conductive ball flow. If there are many second conductive balls CB2, there may be a high probability of occurrence of a short circuit between the plurality of pad electrodes PE1, PE2, and PE3 or between the plurality of bump electrodes BP1, BP2, and BP3. If the thickness t2 of the conductive layer CF is large, the probability of occurrence of the conductive ball flow during the pressing process is high, and thus the probability of occurrence of the short circuit may increase. In the present embodiment, the thickness t2 of the conductive layer CF may be less than about twice the diameter t1 of the conductive ball CB to decrease the probability of occurrence of the conductive ball flow and reduce the probability of occurrence of the short circuit.

Meanwhile, the inventive concept of the present disclosure relates to a system and method for bonding two media using an anisotropic conductive film ACF, and the two media are not necessarily limited to the substrate SUB and the flexible film FF as describe in the above-described embodiments. In a case where the flexible film FF may be omitted, the two media may be the substrate SUB and the driving chip DIC.

Although certain embodiments and implementations have been described herein, other embodiments and modifications will be apparent from the present description. Accordingly, the inventive concepts of the present disclosure are not limited to the described embodiments, but rather to the broader scope of the present disclosure and various obvious modifications and equivalent arrangements as would be apparent to a person of ordinary skill in the art.

What is claimed is:

1. A display device comprising:
   a substrate including a display area and a pad area;
   a plurality of pad electrodes disposed on the pad area;
   a plurality of bump electrodes electrically connected to corresponding ones of the plurality of pad electrodes; and
   an anisotropic conductive film including a conductive layer and a heat absorbing layer,
   wherein the anisotropic conductive film is disposed between the plurality of pad electrodes and the plurality of bump electrodes to electrically connect the plurality of pad electrodes and the plurality of bump electrodes,
   wherein the conductive layer is disposed between the plurality of pad electrodes and the plurality of bump electrodes and includes a conductive ball, and
   wherein the heat absorbing layer is disposed between adjacent ones of the plurality of bump electrodes and includes a first heat absorbing particle.

2. The display device of claim 1, wherein the first heat absorbing particle absorbs light in an infrared light range.

3. The display device of claim 1, wherein the first heat absorbing particle is a metal particle or a metal oxide particle.

4. The display device of claim 1, wherein the first heat absorbing particle includes at least one selected from a group consisting of tungsten oxide, vanadium oxide, iron oxide, carbon nanotube, tellurium oxide, zinc oxide, barium oxide, niobium oxide, aluminum oxide, manganese oxide, aluminum, and iron.

5. The display device of claim 1, further comprising:
   a flexible film including the plurality of bump electrodes and a base film on which the plurality of bump electrodes is disposed,
   wherein the base film includes polyimide.

6. The display device of claim 1, wherein a thickness of the conductive layer is less than about twice a diameter of the conductive ball.

7. The display device of claim 1, wherein a thickness of the conductive layer is about 3.2 μm to about 6.4 μm.

8. The display device of claim 1, wherein the conductive layer further includes a second heat absorbing particle.

9. The display device of claim 8, wherein the second heat absorbing particle includes at least one selected from a group consisting of tungsten oxide, vanadium oxide, iron oxide, carbon nanotube, tellurium oxide, zinc oxide, barium oxide, niobium oxide, aluminum oxide, manganese oxide, aluminum, and iron.

10. The display device of claim 1, wherein the plurality of bump electrodes includes at least one selected from a group consisting of copper and gold.

11. The display device of claim 1, further comprising:
an insulating layer disposed between adjacent ones of the plurality of pad electrodes.

12. The display device of claim 11, wherein the insulating layer includes a third heat absorbing particle.

13. The display device of claim 12, wherein the third heat absorbing particle includes at least one selected from a group consisting of tungsten oxide, vanadium oxide, iron oxide, carbon nanotube, tellurium oxide, zinc oxide, barium oxide, niobium oxide, aluminum oxide, manganese oxide, aluminum, and iron.

* * * * *